Nov. 10, 1953 T. F. GOSSARD 2,658,394

TUNER

Filed May 16, 1951 2 Sheets-Sheet 1

INVENTOR.
THOMAS FISHER GOSSARD

BY Ostrolenk & Faber

ATTORNEYS

INVENTOR.
THOMAS FISHER GOSSARD

BY Ostrolenk & Faber

ATTORNEYS

Patented Nov. 10, 1953 2,658,394

UNITED STATES PATENT OFFICE 2,658,394

TUNER

Thomas Fisher Gossard, North Hollywood, Calif., assignor to Standard Coil Products Co. Inc., Los Angeles, Calif., a corporation of Illinois Application May 16, 1951, Serial No. 226,718

2 Claims. (Cl. 74—10.45)

This invention relates to television frequency selectors of the type now known generally as television tuners and is directed more particularly to the arrangement of the fine or vernier tuning elements of the local oscillator structure.

In frequency selectors of the television tuner type, a step by step tuning arrangement is provided operated by a rotatable shaft to move successively a plurality of inductors into engagement with contact elements in order to tune the unit to the different television channels. As disclosed in prior application Serial Number 218,162, a fine or vernier tuning arrangement is also provided. Since it has become customary in television sets to make the fine tuner co-axial with the channel selector, it has long been desirable to make the fine tuning shaft on the booster co-axial with the booster channel selector.

However, in television pre-amplifier or booster constructions, it is often necessary owing to the desired compactness of design and the placement of associated components to mount the fine tuning condenser in a position axially displaced from the main axis of rotation of the channel selector. Moreover, in television boosters it is necessary to isolate the fine tuning unit away from the rest of the circuit to avoid distortion caused by electrostatic coupling. This displacement is necessary to avoid expensive shielding components. This has led to the use of a separate fine tuning knob of a different location from the channel selector. One of the elements that has made this prior result necessary is the inherent need for making the booster as inexpensive as possible since the user, after having obtained a television set, resists further substantial expenditure directed to increasing its performance.

An important object of the present invention is the provision of a single inexpensive operating device for the fine tuner of a television booster where the fine tuner is axially displaced from the main channel selector but wherein nevertheless the fine tuner control is co-axial with the channel selector control so that the user is presented with an arrangement which has become familiar from use of the television set itself.

To accomplish this object, my invention contemplates in one of the modifications thereof, mounting a rotatable sleeve on the shaft of the principal channel selector and utilizing a shaft parallel to the channel selector shaft to operate the fine tuner. The latter shaft carries a resilient sector. The sector has a stop at each end and is placed in frictional relation with an appropriate portion of the sleeve on the main shaft. Rotation of the sleeve therefore results in rotation of the fine tuning shaft, the turn ratio being determined by the radius of curvature of the arcuate bend of the fine tuner shaft as compared with the radius of the sleeve. Consequently, with a fine tuner which rotates a maximum of 90°, the sleeve may be rotated as much as 270° or even more so that delicate adjustment is possible. Possible slippage offers no obstacle, since fine tuning is adjusted subjectively by aural and visual results rather than by calibration.

Moreover, rotation of the main shaft by a direct linkage is subject to maintenance considerations mainly due to the shock caused at the extremities of rotation when the main tuning shaft is rotated in the wrong direction. When the main tuning shaft is turned to one extremity and further rotation is attempted, misalignment occurs which is proportional to the torque applied. A large torque applied to a direct linkage mechanism will break a component thereof.

An important object of the present invention is to provide a novel fine tuning mechanism for television where the fine tuning may be initiated on a shaft concentric with the shaft for the rough tuning.

Still another object of the present invention is the provision of a novel mechanism for driving two shafts, both having essentially the same direction of axis.

Still another object of the present invention is the provision of a simple tuning assembly for television tuners.

Still another object of the present invention is the provision of a novel tuning mechanism utilizing a tension member for the frictional means.

Still another object of the present invention is the provision of a fine tuning mechanism that permissibly slips when rotated beyond fixed limits.

Still another object of the present invention is the provision of a fine tuning mechanism which turns through a lesser angle than the fine tuning knob.

Still another object of the present invention is the provision of a novel tuning mechanism utilizing a resilient sector as a frictional member.

Still another important object of the present invention is to provide a novel fine tuning mechanism for television where the fine tuning may be initiated on a shaft concentric with the shaft for the rough tuning.

Still another object of the present invention is the provision of a fine tuning mechanism that permissibly slips when rotated beyond fixed limits.

The novel features that are considered characteristic of this invention are set forth in the appended claims. The invention, however both as to its organization and method of operation, as well as additional objects and advantages thereof, will best be understood from the following description when read in conjunction with the drawings, in which Figure 1 is a partially exploded view of a modification of the invention.

Figures 1, 3:
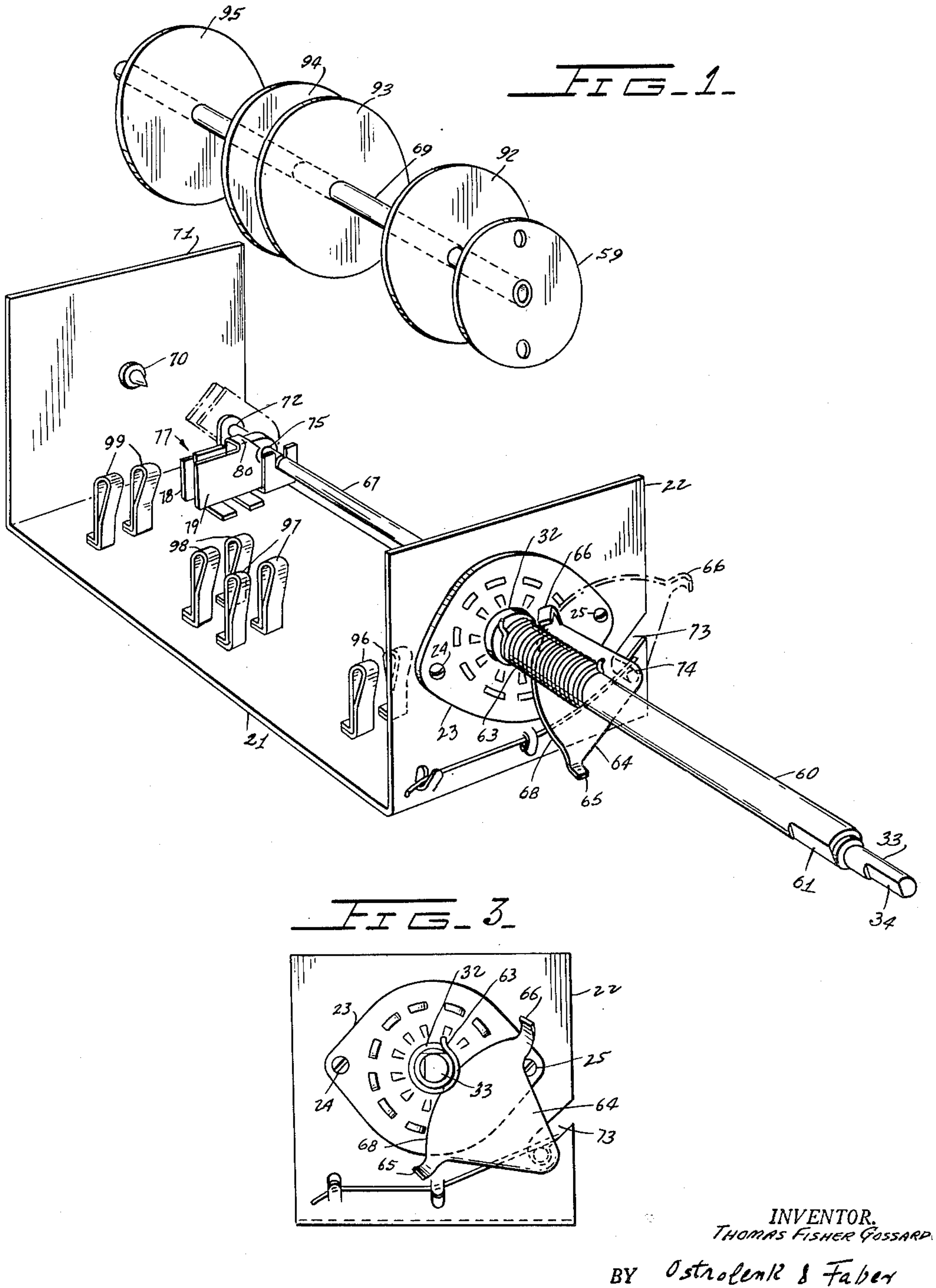
Figure 3 is a front view of a portion of my invention.
Figures 2, 4, 5, 6, 7, 8:
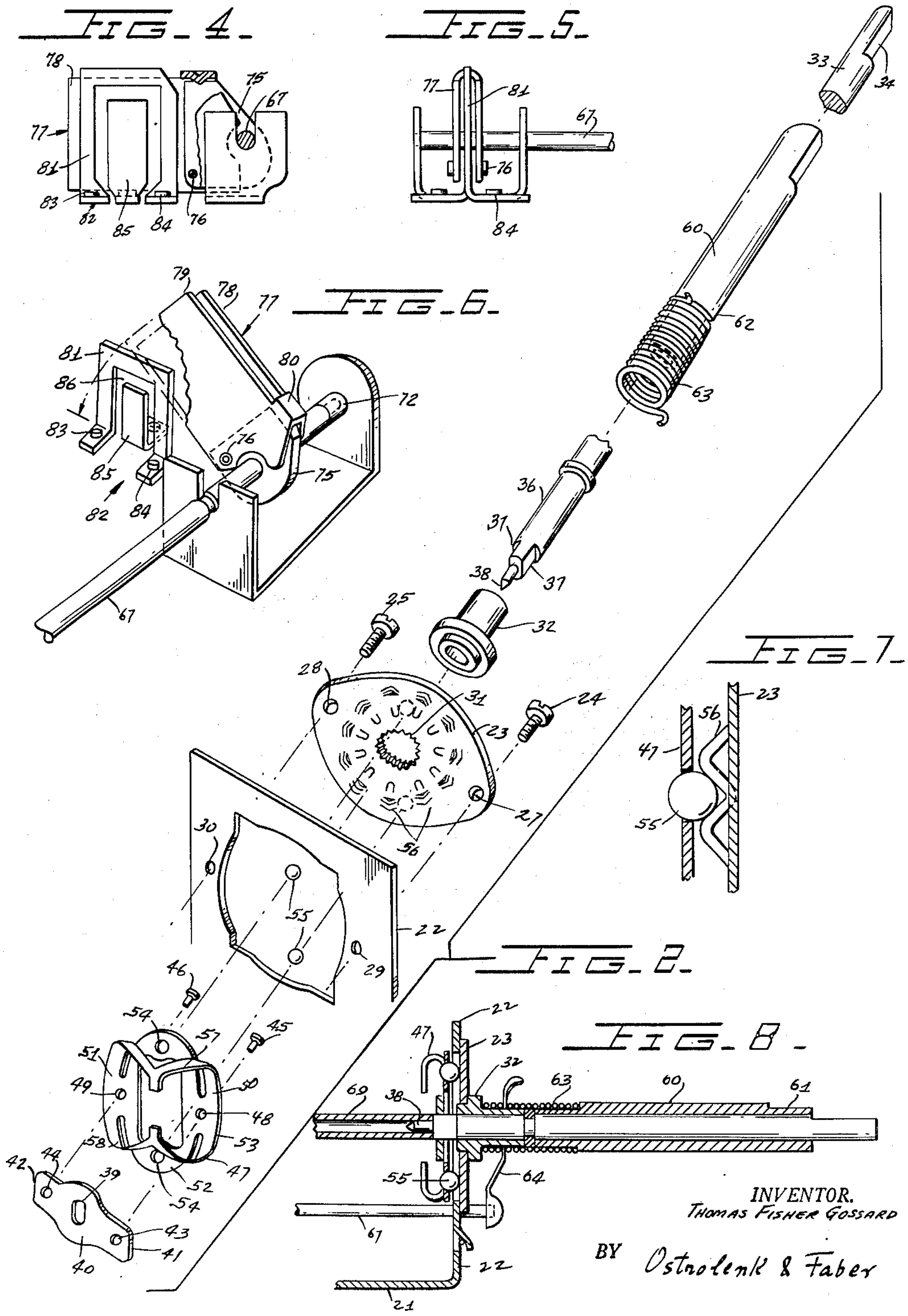
Figure 2 is an exploded view of a portion of the invention.
Figure 4 is one side view of a portion of my invention.
Figure 5 is another side view along line A—A of Figure 4.
Figure 6 is a pictorial view of a portion of my present invention.
Figure 7 is a sectional view of a portion of my present invention.
Figure 8 is a sectional view of a portion of my invention.

Referring now to Figure 1, the base 21 has a front panel 22. The front panel 22 supports the notched member 23 by means of two screws 24 and 25 over the opening 26. The screws 24 and 25 fit through the holes 27 and 28 in the notched member 23 and thread the holes 29 and 30 in the front panel 22. The notched member 23 has a centrally located multi-toothed opening 31, which opening 31 seats a brass bushing 32, shown also in Figure 2.

The bushing 32 rotatably supports a shaft 33. The shaft 33 is the rough tuning or channel selector shaft and has a milled portion 34. The milled portion 34 supports a knob, not shown. The shaft 33 also supports a hollow fine tuning shaft 60, hereinafter described.

The end 36 of the shaft 33 has two diametrically opposed milled faces 37 and a pin 38 as an integral part thereof. The end 36 protrudes from the bushing 32 and fits into the opening 39 of crank member 40. The crank member 40 has diametrically opposed arms 41 and 42. The arms 41 and 42 have holes 43 and 44, respectively.

The crank member 40 is riveted by means of rivets 45 and 46 through openings 43 and 44 to a resilient rotatable member 47. The resilient member 47 bears the rivets 45 and 46 in openings 48 and 49, respectively.

The openings 48 and 49 are located in the junctions 50 and 51 which join the two units 52 and 53 of the resilient member 47. The unit 52 is elliptically shaped and has two diametrically opposed openings 54. The openings 54 seats ball bearings 55 against the notched member 23. The diameter of the opening 54 is slightly smaller than the diameter of the bearings 55. The bearings 55 are seated between the rounded notches 56 shown more particularly in Figure 7.

The rotation of shaft 33 causes the crank 40 bearing resilient member 47 to rotate. The rotation of the resilient member 47 causes the bearings 55 to ride over the notches 56 to a subsequent position between two other notches 56.

The other unit 53 of resilient member 47 is also elliptically shaped and is bent at 57 and 58 to resiliently support a disk 59, hereinafter described, shown in Figure 1.

The shaft 33 supports a hollow shaft 60. The hollow shaft 60 is milled at one end 61 to support a knob, not shown.

At the other end 62 of the hollow shaft 60 is rigidly attached a coil spring 63. The spring 63 may be fixed to the shaft 60 by brazing or by tight threading or by any other means known in the art. The spring 63 is in frictional relationship with a resilient member 64. The resilient member 64 is shaped as the sector of a circle and has two extensions 65 and 66. The member 64 is rigidly supported on a shaft 67 either by a welded connection or otherwise.

The rotation of the hollow shaft 60 causes the rotation of the resilient shaped member 64 and thus the shaft 67.

The contact between the spring 63 and the resilient member 64 is a high frictional one. The resilient member 64 is deformed against the spring 63. The contacting arcuate edge 68 of the member 64 bears tangentially against two surfaces of the spring 63 as it fits into the space between the coils of the spring 63. The construction results in a substantially positive drive with no slippage.

The extensions 65 and 66 come into contact with the spring 63 and prevent further rotation of the resilient member 64. Further rotation of the hollow shaft 60 causes slippage between the resilient member 64 and the coil spring 63.

The shaft 67 performs the fine tuning in a manner hereinafter described.

The pin 38 helps support a partially hollow shaft 69. The shaft 69 is suspended between one support, the pin 38 on the front panel 28 and upon a bearing pin 70, as shown in Figure 1, on a back panel 71. The shaft 69 has firmly attached to the front thereof a circular disk 59. The disk 59 is removably attached to the crank 40 and the resilient member 47 so that upon rotation of the shaft 33 the crank 40, the resilient member 47, the disk 59 and the shaft 69 all rotate together. The shaft 69 also carries four tuning inductors 92, 93, 94 and 95. The tuning inductors 92, 93, 94 and 95 bear against spring contacts 96, 97, 98 and 99, as shown in Figure 1.

The rotation of shaft 33 by means of a knob, not shown, causes the tuning inductors 92 through 95 to rotate, changing the frequency that the tuner passes.

The shaft 67 as shown in Figures 1, 4, 5 and 6 carries a variable condenser unit, hereinafter described. The shaft 67 is positioned on the back panel by means of a hole 72 and on the front panel 26 by means of a slot 73. The shaft 67 has a grove 74 which fits into the slot 73. The shaft 67 has rigidly attached thereto a partially circular dielectric member 75. The partially circular dielectric member 75 has rigidly attached thereto by means of a rivet 76 a plate assembly 77. The plate assembly 77 is thus insulated from the shaft 67. This insulation is provided to eliminate sliding contacts wherever possible since sliding metallic contacts contribute appreciably to the noise during the operation of a fine tuner.

Another reason for insulating the plate assembly 77 is to reduce the amount of coupling of oscillator energy to the shaft 67.

The plate assembly 77 comprises two metallic plates 78 and 79 which are connected by means of a connection 80, all of which are integral parts of the plate assembly 77.

The rotation of shaft 67 by means described above in reference to Figures 1, 2 and 3 causes the dielectric member 75 and the plate assembly 77 to rotate. The rotation of the plate assembly 77 causes the plate assembly 77 to rotate over a U-shaped conductor 81 which is rigidly attached to the base 82 by means of two rivets 83 and 84. The plate assembly 77 also rotates over a substantially rectangular member 85 which is seated centrally in the opening of the U-shaped member 81.

The rectangular plate 85 lies substantially in the same plane as the space 86 which is between the two plates 78 and 79 and also in the same plane as the U-shaped member 81. The U-shaped member 81 and the rectangular plate 85 are essentially of the same thickness and preferably of the same conducting material having approximately a $\frac{1}{16}$ of an inch rectangular gap between the rectangular member 85 and the U-shaped member 81. The central rectangular plate 85 is connected to the base 82 of the tuner. The rotation, then, of the plate assembly 77 increases the capacity between the U-shaped member 81 and the rectangular member 85. The increasing capacity is due to two series capacitors, one from the U-shaped member 81 to the plates 78 and 79 and the other from the movable plates 78 and 79 to the rectangular plate 85.

While certain preferred embodiments of the invention have been specifically disclosed, it is understood that the invention is not limited thereto, as many variations will be readily apparent to those skilled in the art and the invention is to be given its broadest possible interpretation within the terms of the following claims:

I claim:

1. In a tuning device having a plurality of individually selectable pre-tuned elements; a rotatable shaft for effecting the selection of said pre-tuned elements; an additional infinitely variable tunable element rotatively operable between predetermined limits on a shaft having an independent axis displaced from said first mentioned rotatable shaft; co-axial operating members for said rotatable shaft and said variable tunable element comprising an operating shaft for said variable tunable element; means for rotating said first mentioned rotatable shaft; a sleeve rotatably mounted on said first mentioned rotatable shaft; means for rotating said sleeve; and a connection between said sleeve and said second mentioned shaft, said connection comprising a coiled spring mounted on and rigidly attached to said sleeve; and a resilient sector shaped member; said resilient shaped member having one end rigidly attached to said second mentioned shaft and the other end in tangentially frictional engagement with said coiled spring.

2. In a tuning device having a plurality of individually selectable pre-tuned elements; a rotatable shaft for effecting the selection of said pre-tuned elements; an additional infinitely variable tunable element rotatively operable between predetermined limits on a shaft having an independent axis displaced from said first mentioned rotatable shaft; co-axial operating members for said rotatable shaft and said variable tunable element comprising an operating shaft for said variable tunable element; means for rotating said first mentioned rotatable shaft; a sleeve rotatably mounted on said first mentioned rotatable shaft; means for rotating said sleeve; and a connection between said sleeve and said second mentioned shaft, said connection comprising a coiled spring mounted on and rigidly attached to said sleeve; and a resilient sector shaped member; said resilient shaped member having one end rigidly attached to said second mentioned shaft and the other end in tangentially frictional engagement with said coiled spring, said end in tangential frictional engagement with said coiled spring having two stops for limiting the rotation of said second mentioned shaft.

THOMAS FISHER GOSSARD.

References Cited in the file of this patent

UNITED STATES PATENTS

| Number | Name | Date |
|---|---|---|
| 1,703,331 | Aldeen | Feb. 26, 1929 |